United States Patent
Zappacosta

(10) Patent No.: US 6,700,791 B1
(45) Date of Patent: Mar. 2, 2004

(54) COMPUTER EXPANSION CARD RETAINER ASSEMBLY

(75) Inventor: Elisa E. Zappacosta, North Sioux City, SD (US)

(73) Assignee: Gateway, Inc., Poway, CA (US)

( * ) Notice: Subject to any disclaimer, the term of this patent is extended or adjusted under 35 U.S.C. 154(b) by 424 days.

(21) Appl. No.: 09/361,514

(22) Filed: Jul. 27, 1999

(51) Int. Cl.$^7$ .................................................. H05K 5/06
(52) U.S. Cl. ...................... 361/759; 361/686; 361/740; 361/741; 361/747; 361/752; 361/756; 361/801; 361/802
(58) Field of Search ................................ 361/683, 668, 361/753, 756, 758, 788, 796, 799–802, 740, 741, 747, 759, 816, 818; 174/35 R, 36 GC, 51; 439/607

(56) References Cited

U.S. PATENT DOCUMENTS 5,757,618 A * 5/1998 Lee ............................. 361/686

* cited by examiner

Primary Examiner—David Martin
Assistant Examiner—Phuong T. Vu
(74) Attorney, Agent, or Firm—Scott Charles Richardson; Laurence R. Letson

(57) ABSTRACT

An attachment mechanism for retaining expansion circuit boards in the mounting panel of a computer is disclosed. The attachment mechanism comprises a span extending between two displaced fastener openings on the mounting panel of the computer and depending therefrom a plurality of the fingers or tabs to engage the mounting bracket of the expansion circuit boards. By engaging a plurality of the expansion circuit boards with the fingers or tabs, all of the circuit boards may be clamped and reliably retained in position with substantially uniform force and the use of a minimum number of fasteners. The tabs or fingers extend generally perpendicular to the span of the bracket such that the span of the bracket provides substantial rigidity and insures substantially equal force being exerted by the tabs or fingers onto the mounting brackets of the electronic circuit boards. The use of a minimum number of fasteners shortens the time necessary for assembly and reduces the part count.

12 Claims, 3 Drawing Sheets

COMPUTER EXPANSION CARD RETAINER ASSEMBLY

FIELD OF THE INVENTION

This invention relates to a computer expansion card retainer assembly bracket and more specifically to the assembly of a computer housing and computer expansion cards.

BACKGROUND OF THE INVENTION

Personal computers, servers, and other similar computers are provided with a housing, with panels with openings or slots formed therein, typically a back panel. The back panel forms the openings and the openings are provided to accommodate the addition of electronic circuit cards for additional functions of the computer; the electronic circuit cards typically are referred to as expansion cards or expansion electronic circuit boards.

Previously, expansion cards have been individually mounted by retaining screws to the panel or mounting panel of computer housing. In the assembly process to install or to add an electronic circuit board, it is necessary to remove the individual retaining screw, remove a cover plate covering the opening, and install the expansion electronic circuit board; then, the screw must be reinstalled to retain the expansion electronic circuit board in the proper position relative to the mounting panel of the computer housing. Although a seemingly simple task, removal of a screw and the panel frequently results in a screw being dropped into the other electronics of the computer. If not located and removed carefully, the presence of a screw can cause electrical or physical damage to the computer electronics.

Additionally, time expended to assemble the computer and all of the expansion cards or the removable shields over the unused openings in the mounting panel is substantial. Moreover, a larger number of parts are required in that procedure than with this invention.

At least to the extent of the adding electronic expansion cards, computers are frequently serviced by the owner or operator of the computer rather than highly trained service technicians. Reducing the number of parts and steps required for installing or removing the components, such as adding expansion cards to the mounting panel of the computer housing minimizes potential damage or error by the customer.

OBJECTS OF THE INVENTION

It is an object of the invention to mount electronic circuit boards in a mounting panel of a computer housing with a substantially uniform retaining force.

It is another object of the invention to simplify installation of expansion circuit boards in a computer housing.

It is a further object of the invention to reduce the potential for damage to the computer by dropped screws or lost parts during assembly or the installation or removal of expansion circuit boards in a computer.

It is an additional object of the invention to reduce the number of parts necessary to install expansion circuit boards in a computer, thereby reducing the time and complexity of manufacturing.

It is a further object of the this invention to secure the seating of expansion boards of varying dimensional tolerances.

It is yet another object of the invention to provide a seal for electromagnetic interference from the boards and computer as a whole.

SUMMARY OF THE INVENTION

The shortcomings and deficiencies of the prior techniques used to assemble computers and electronic expansion circuit boards are overcome, and the objects of the invention are accomplished by the present invention.

A retainer bracket, having a span and extending between two displaced fasteners holes in the mounting panel of a computer housing, is used to retain a plurality of electronic expansion circuit boards. The retainer bracket comprises a span of material which not only extends slightly beyond two of the fastener holes in the mounting panel but also has fastener holes formed near the ends of the bracket to align with the fasteners holes in the mounting panel. Further, a plurality of tabs or fingers depend from the span of material. The material is substantially rigid such as steel, such that the tabs or fingers exert a retaining force against brackets used for mounting the electronic expansion circuit boards to the mounting panel of the computer. The electronic expansion circuit boards are positioned with respect to the mounting panel, the bracket placed over an end of the mounting bracket, is forced to a position that the fastener holes of the retaining bracket align with the respective fastener holes in the mounting panel, and then retained by screws or other suitable fasteners.

The bracket used to retain the electronic circuit boards in their proper position relative to the mounting panel and to exert a substantially equal force on each of the mounting brackets not only reduces the part count but also reduces problems associated with dropped screws and the potential for electronic failure or damage to the components of the computer.

A more complete understanding of the invention may be derived from of the attached drawing and the detailed description of the invention which follows.

DETAILED DESCRIPTION OF THE BEST MODE OF THE PREFERRED EMBODIMENT OF THE INVENTION AS CONTEMPLATED BY THE INVENTOR

Figure 1:
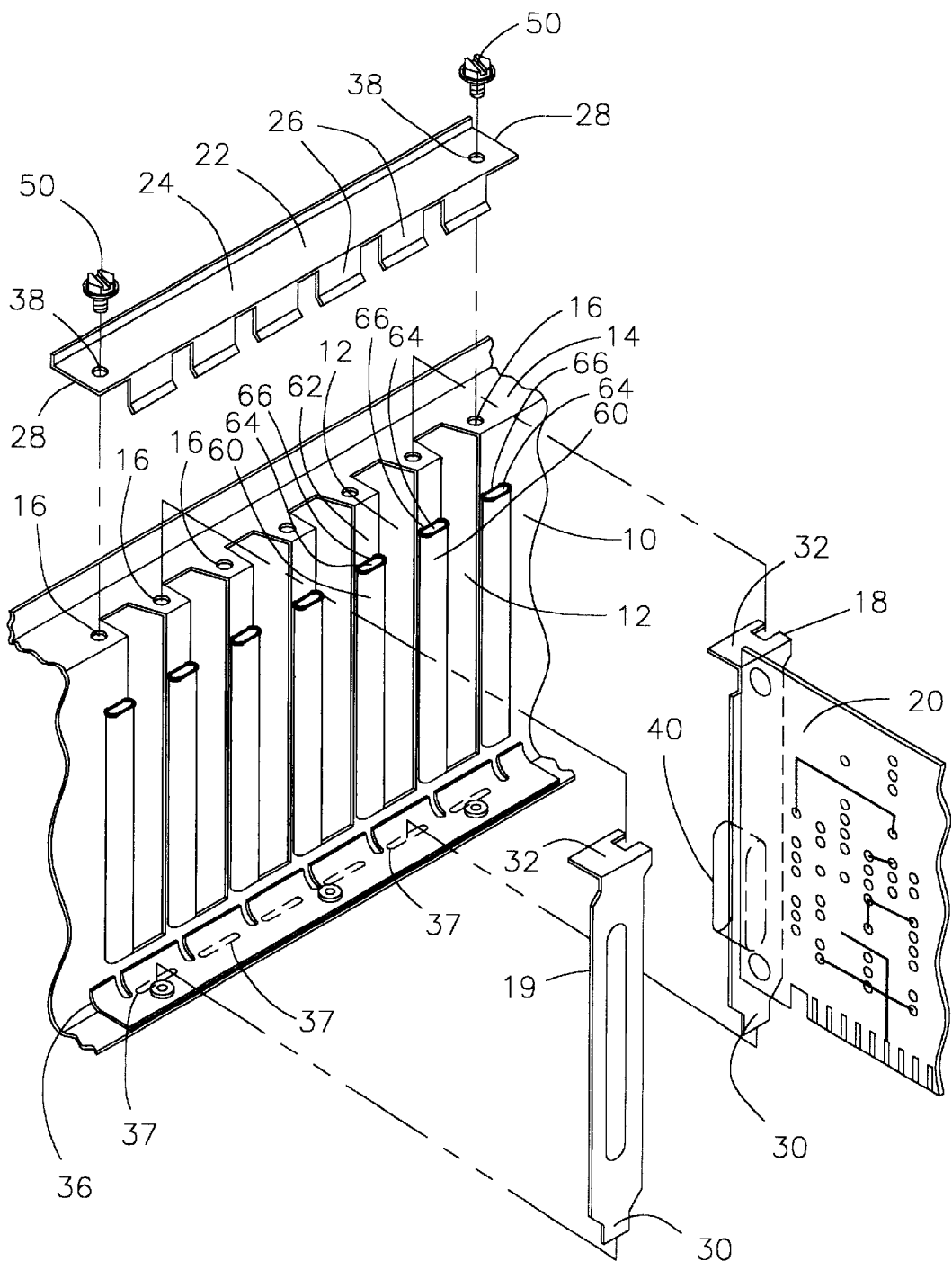
FIG. 1 illustrates in an exploded view, the expansion circuit board mounting panel of a computer housing, an electronic circuit board with its related mounting hardware, and the retainer bracket with fingers which exert force onto the mounting hardware of the electronic circuit board assembly.
Figure 2:
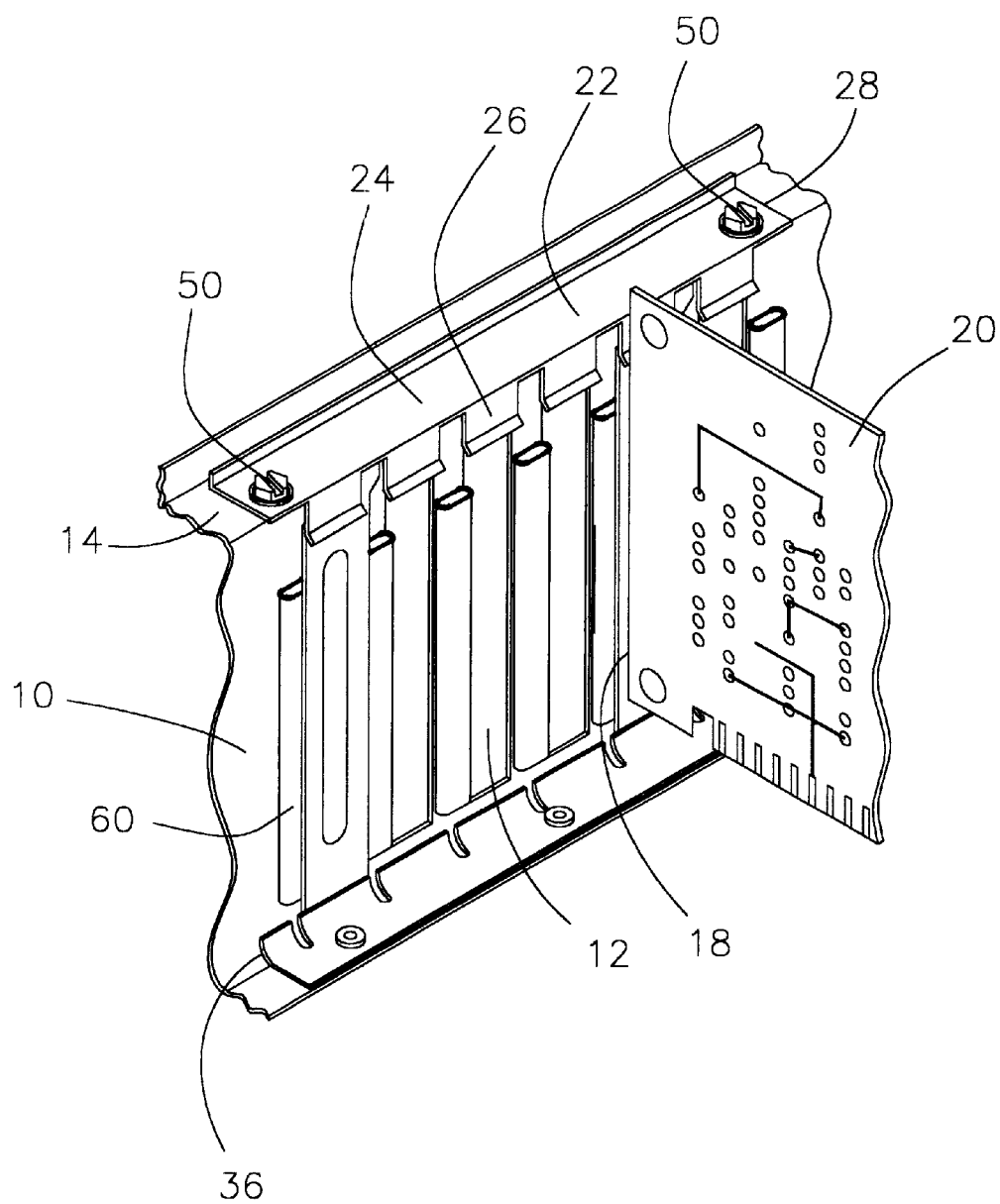
FIG. 2 illustrates the components illustrated in FIG. 1 fully assembled.

Referring to a FIGS. 1 and 2, mounting panel 10 of a computer housing 8 is illustrated as having elongated openings 12 transverse to the longitudinal dimension of panel 10 and extending into the ledge 14 of panel 10. Ledge 14 is further provided with fastener opening 16, typically used to accommodate screws or fasteners 50 for fastening the expansion card mounting brackets 18 to the panel 10. For permanent installations, rivets or pop rivets could be used.

In the present embodiment, the mounting brackets 18, used to connect electronic circuit board 20 to mounting panel 10, are not mounted with individual fasteners to mounting panel 10. Brackets 18 are held in place by a retaining bracket 22 which includes a member 24 having depending therefrom tabs or fingers 26.

Mounting bracket 18 has a tang 30 on the bottom end thereof to be inserted behind retainer bracket 36 and into slots 37 formed into panel 10 to position brackets 18 with connector 40 extending through opening 12 from the interior to the exterior of mounting panel 10. Mounting bracket 18 further has a flange 32, which when properly positioned, resides over a portion of the opening 12 in ledge 14. Once flange 32 and mounting bracket 18 are properly positioned relative to mounting panel 10, retaining bracket 22 may be disposed over flange 32, and both bracket ends 28 with fastener openings 38 may be aligned with fastener openings 16. In aligning fastener openings 38 with fastener opening 16, tabs or fingers 26 will engage the surface of brackets 18 through which connector 40 extends.

The forcing of bracket 22 to such a position whereby fastener openings 38 are aligned with the fastener openings 16, finger 26 will urge and retain bracket 18 into its proper position.

Once bracket 22 is aligned such that fastener openings 38 and fastener openings 16 are aligned, fasteners 50 then may be engaged with mounting panel 10 to retain bracket 22 and bracket 18.

Mounting bracket 18 supports circuit board 20 and connector 40 to provide a connection to the circuit board 20 outside the computer housing 8. Although only one circuit board and mounting bracket 18 has been illustrated for clarity, it should be understood that multiple circuit boards 20 and mounting brackets 18 may be utilized.

The use of retaining bracket 22 to reliably retain mounting brackets 18 to mounting panel 10 of a computer housing 8 reduces the number of screws necessary for mounting electronic circuit boards 20 within a computer housing 8 and simplifies the assembly of the electronic circuit boards 20 into a computer.

Additionally the use of individual fingers 26 to engage the mounting brackets 18 both insure a substantially uniform force exerted on each of the mounting brackets 18 as well as a consistent position for each mounting bracket 18, connector 40, circuit board 20, and the mounting panel 10. Each electronic circuit board 20 connects to a mother board, (not shown). The use of the retaining bracket 22 and its consistent positioning of mounting bracket 18 and electronic circuit board 20 greatly enhances the reliability of the connection between electronic circuit board 20 and the mother board.

A reduction in the number of screws used to assemble the mounting panel 10 and associated mounting brackets 18 consequently reduces the amount of assembly time necessary. Furthermore, a consumer handles a lesser number of screws if installing and/or removing multiple circuit boards 20 from the computer housing 8. Fewer screws in the assembly reduces the potential for damage to the electronics of the computer caused by a mishandled or dropped screw. The use of existing brackets 18 as well as existing cover plates 19 is permitted, thereby saving further design and inventory changes.

To address leakage concerns and reduce electromagnetic interference, a conductive compressible member 60 is disposed on the portions 62 of panel 10 partially defining openings 12. The conductive compressible member 60 is preferably fabricated from conductive fabric and a compressible material, such as a strip of foam 64 or other resilient materials such as rubber or rubber-like materials, surrounded by conductive fabric sleeve 66. As the bracket 18 or a cover 19 is mounted to mounting panel 10, the tubular fabric conforms to the space between the mounting panel 10 and bracket 18, thereby effectively forming a barrier to potential leakage of electromagnetic interference. The compressible member 60 is easily attached to panel 10 by an adhesive, not shown which may or may not be conductive. The conductive path from the conductive fabric 66 of the compressible member 60 is either through the mounting panel 10 by contact with the compressible member or through a conductive adhesive. An alternative conductive path to ground is through the mounting bracket 18, tab 26, the bracket 22 and the mounting panel 10. Tabs 26 in bracket 22 are formed to flex as leaf springs against mounting bracket 18 upon insertion of a circuit board 20, thereby maintaining tension and contact of tab 26 against mounting bracket 18.

While the bracket 22 is illustrated as having the tabs 26 generally formed to be perpendicular to the span 24, the bracket 22 need not be so formed if a suitable attaching surface permits the positioning span 24 in the same plane as the tabs 26. However, the illustrated form of bracket 22 is preferable because of the rigidity of the bracket 22 due to the form of the bracket 22 as shown in FIGS. 1 and 2. Bracket 22 is far less subject to deformation because of the much larger forces required to deform a plate in the plane of the plate and thereby insures a more uniform force distribution to the mounting brackets 18 and the covers 19.

The use of bracket 22 may be accomplished with existing style mounting brackets 18 and existing design mounting panels 10 as long as the faster openings 38 are positioned at an appropriate spacing to align with a fastener opening 16. Due to the exertion of force onto fingers 26 by the mounting bracket 18, the forces exerted on elongated member 24 will be generally in the plane of member 24. Member 24 will display a high degree of rigidity and resist yielding to any forces exerted by mounting brackets 18 on fingers 26 near the mid-point of the span of member of 24 between fasteners 50.

Figure 3:
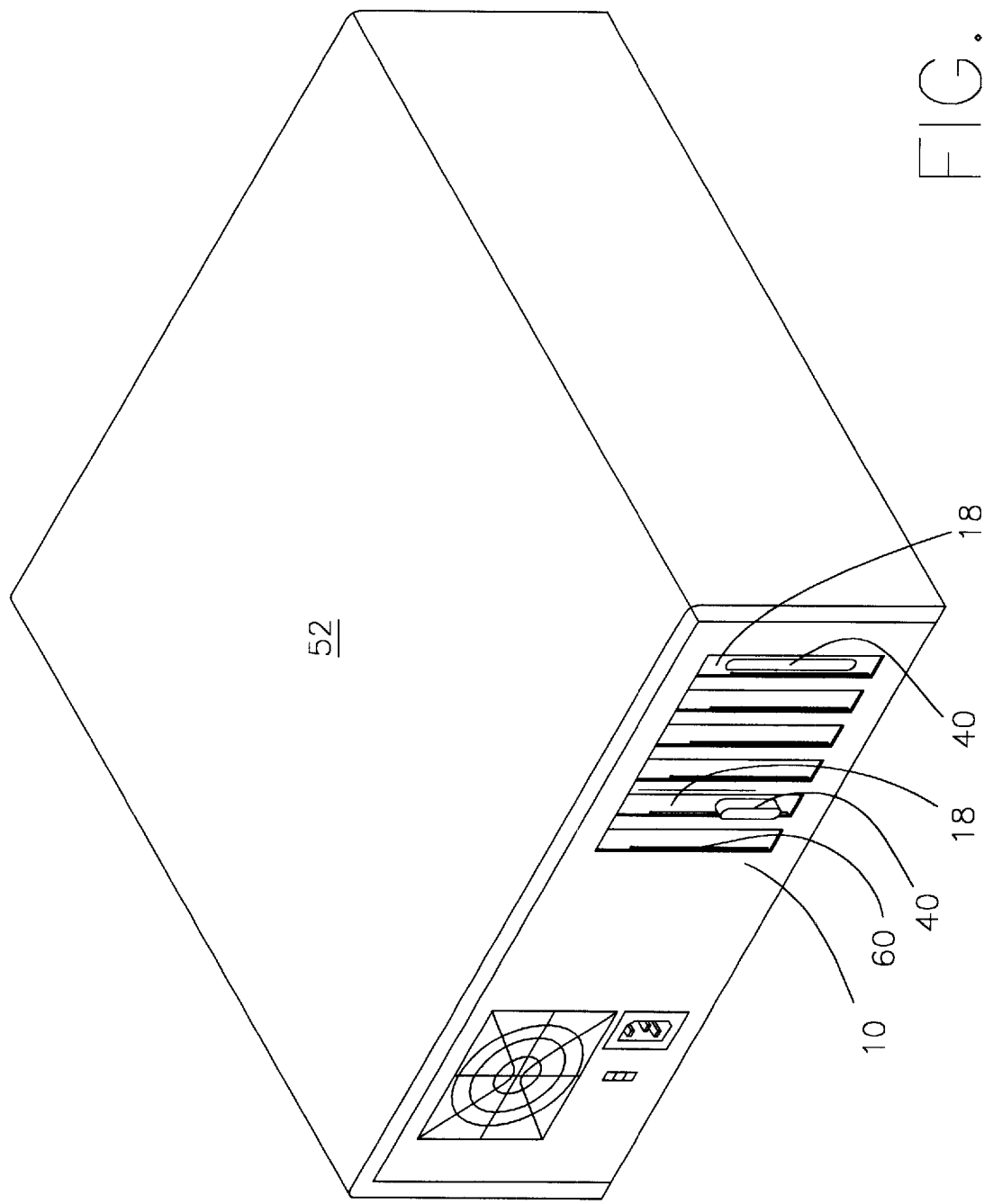
FIG. 3 illustrates a computer unit housing with a mounting panel and installed circuit board mounting brackets and connectors.

FIG. 3 illustrates the rear perspective view of a computer housing 52 with the mounting panel 10 assembled with mounting brackets 18 and cover plates 19. Compressible members 60 are illustrated intermediate the brackets 18/cover plates 19 and mounting panel 10.

One of skill in the art will understand that changes in the shapes or configurations of the various elements of the assembly may be made while preserving the functions of the various elements and still not remove the resulting devices from the scope of the protection afforded by the attached claims.

What is claimed is:
1. A computer assembly comprising:
a mounting panel comprising a plurality of elongated openings, said mounting panel comprising at least a pair of fastener receiving holes;
at least one electronic circuit board assembly, each electronic circuit board assembly comprising a mounting bracket, said mounting bracket disposed juxtaposed to one of said elongated openings;
said mounting bracket comprising an extended portion extending from one end of said mounting bracket for engaging said mounting panel and a connector projecting through said elongated opening;
a retention bracket comprising an elongated panel, a plurality of fastener openings and a plurality of depend- ing force exerting members, said depending members engaging said mounting bracket of the said at least one electronic circuit board;

said retention bracket attached to said mounting panel by fasteners engaging said fastener openings, whereby said electronic circuit board is mounted with respect to said mounting panel.

2. The computer assembly of claim 1 wherein said plurality of depending force exerting members forcibly engage said mounting bracket and urge said mounting bracket toward said mounting panel.

3. The computer assembly of claim 1 wherein each said mounting brackets is engaged by an individual depending force exerting member.

4. The computer assembly of claim 1 wherein said depending members are oriented approximately perpendicular to said elongated panel.

5. A computer assembly comprising:

a mounting panel comprising elongated openings, said mounting panel comprising at least a pair of fastener receiving holes;

at least one electronic circuit board assembly, each said assembly comprising a mounting bracket disposed juxtaposed to one of said elongated openings and an electronic circuit board;

said mounting bracket comprising a member disposed on an edge of said electronic circuit board;

said mounting bracket retainingly engaged with said mounting panel; and a retaining bracket comprising force exerting fingers engaged with said mounting bracket and biasing said mounting bracket against said mounting panel, whereby said at least one electronic circuit board assembly is forced against and retained on said mounting panel.

6. The computer assembly of claim 5 wherein said fingers are disposed substantially perpendicular to a span of material supporting said fingers.

7. The computer assembly of claim 5 wherein said fingers bias said mounting bracket toward said mounting panel and said retaining bracket further comprises a plurality of openings for accepting fasteners for fastening said retaining bracket to said mounting panel.

8. The computer assembly of claim 5 further comprising a conductive compressible member disposed intermediate said mounting panel and said mounting bracket and compressed therebetween, thereby forming a barrier to electromagnetic radiation.

9. A computer assembly comprising:

a means for housing electronic apparatus of said computer assembly, said electronic apparatus including electronic circuit boards and a mounting bracket joined thereto and a connector means for connecting to connectors exterior to said means for housing;

a means for mounting said mounting bracket to said means for housing;

means for retaining said mounting bracket relative to said means for housing, said means for retaining comprising a means for attachment to said means for housing and a plurality of means for engaging said mounting bracket and forcing said mounting bracket against said means for mounting.

10. The computer assembly of claim 9 wherein said means for attachment comprises a member supporting a plurality of finger means each engageable with one of said mounting brackets for urging said mounting bracket into surface engagement with said means for mounting and holding said mounting brackets relative to said means for housing.

11. The computer assembly of claim 10 wherein said member comprises a plurality of fastener receiving openings and is planar in shape.

12. The computer assembly of claim 10 wherein said member supports said plurality of means for engaging said mounting bracket at a substantially right angle to said member.

\* \* \* \* \*